United States Patent
Jankovic et al.

(10) Patent No.: US 11,844,194 B2
(45) Date of Patent: Dec. 12, 2023

(54) POWER ELECTRONIC COOLING SYSTEM AND METHOD

(71) Applicant: Rockwell Automation Technologies, Inc., Mayfield Heights, OH (US)

(72) Inventors: Zeljko Jankovic, Mequon, WI (US); Garron Koch Morris, Whitefish Bay, WI (US); Timothy James Strandt, New Berlin, WI (US); Junsheng Mu, Shanghai (CN); Yiqing Lin, Shanghai (CN); Jianfeng Wu, Shanghai (CN); Tongxi Wu, Shanghai (CN); Haochen Zhu, Shanghai (CN)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 273 days.

(21) Appl. No.: 17/354,679

(22) Filed: Jun. 22, 2021

(65) Prior Publication Data
US 2022/0408598 A1    Dec. 22, 2022

(51) Int. Cl.
*H05K 7/20*    (2006.01)
*F24F 11/65*    (2018.01)
*F24F 110/20*    (2018.01)

(52) U.S. Cl.
CPC .......... *H05K 7/20281* (2013.01); *F24F 11/65* (2018.01); *H05K 7/20945* (2013.01); *F24F 2110/20* (2018.01)

(58) Field of Classification Search
CPC .......... F24F 11/65; F24F 2110/20; F24F 5/00; F24F 6/00; F24F 11/00; F24F 2203/00;

(Continued)

(56) References Cited

U.S. PATENT DOCUMENTS

| 9,092,030 B2 | 7/2015 | Weiss et al. |
| 2004/0143467 A1* | 7/2004 | McAllister ............. G06Q 10/10 705/37 |

(Continued)

FOREIGN PATENT DOCUMENTS

| CN | 106411153 A | 2/2017 |
| CN | 112367002 A | 2/2021 |

OTHER PUBLICATIONS

Alkharabsheh et al., Failure Analysis of Direct Liquid Cooling System in Data Centers, Jun. 2018, JournalofElectronicPackaging, vol. 140, pp. 1-8. (Year: 2018).*

(Continued)

*Primary Examiner* — Kidest Bahta
(74) *Attorney, Agent, or Firm* — Fletcher Yoder, P.C.

(57) ABSTRACT

Thermal monitoring and analysis of conditions in a power electronic system include sensing of thermal parameters of interest, such as temperature and humidity in an enclosure housing power electronic components. The components are cooled by a liquid coolant flow from a chiller through chiller plates associated with the power electronic components. Air is circulated through the enclosure for heat rejection from the chiller plates. Based on the sensed parameters, factors such as relative humidity and dew point of the cooling air may be computed and evaluated to determine the potential for condensation. Alarms, notices, or recommendations may be output for regulation of the chiller to avoid condensation. The system may also provide for evaluation of installation errors, and degradation of performance over time.

17 Claims, 5 Drawing Sheets

(58) Field of Classification Search
CPC ..... F24F 3/00; H05K 5/0213; H05K 7/20281; H05K 7/20909; H05K 7/20927; H05K 7/20945; H05K 10/00; H05K 9/00; H05K 2201/00

See application file for complete search history.

(56) References Cited

U.S. PATENT DOCUMENTS

| | | |
|---|---|---|
| 2013/0128455 A1 | 5/2013 | Koblenz et al. |
| 2014/0027089 A1 | 1/2014 | Hisada |
| 2014/0265976 A1* | 9/2014 | Weiss ............... H02P 31/00 |
| | | 702/183 |
| 2018/0160571 A1* | 6/2018 | Baker ............... H02S 40/42 |
| 2019/0238081 A1* | 8/2019 | Kopko ............... H02P 27/08 |
| 2019/0239367 A1 | 8/2019 | Elliott |

OTHER PUBLICATIONS

Extended European Search Report for EP Application No. 22180201.0 dated Nov. 25, 2022, 10 pages.

* cited by examiner

POWER ELECTRONIC COOLING SYSTEM AND METHOD

BACKGROUND

The present invention relates generally to the field of power electronic devices, and particularly to devices used in industry and cooled by liquids.

A myriad of applications exist in industry for power electronic devices and systems. Among the most ubiquitous are motor drives of various types, which include circuits for driving an electromagnetic machine, such as a single or three-phase electric motor. Motors driven in many applications may range from fractional horsepower to large, medium or high voltage equipment. Multiple motor drives may be positioned across various parts of a factory or manufacturing site. In the case of higher power applications, multi-phase motors are commonly used with separate motor drives that may be positioned in cabinets in the general vicinity of the driven motor.

Motor drives, and other industrial power equipment typically comprise a number of circuits that may generate significant amounts of heat during operation. This is particularly the case of rectifier circuits, inverter circuits, capacitor groups, and so forth. When possible, these may be cooled by ambient air that is drawn into and around the circuits or within panels and cabinets in which they are positioned and interconnected. However, where circulating air is insufficient for the component power density, liquid cooling systems may be provided. These may circulate a cooling liquid, such as water with appropriate additives, in order to take up heat and discharge it outside the environment of the circuitry.

In liquid-cooled power electronic systems, one issue that may arise is the creation and accumulation of condensation on or around components and the cooling structures to which they may be mounted. In particular, when the temperature of surfaces of these components is reduced below the dew point, such condensation may occur. Such condensation would desirably be eliminated to avoid damaging electronics and creating unplanned machine downtime, though no existing systems truly effectively address the issue. Other potential issues with liquid cooled power electronics include degradation of cooling structures over time, initial erroneous connection of liquid flow paths to the cooling liquid supply, unintentional blockage/reduction of flow, contamination accumulation, inappropriate coolant type, and so forth. At present no effective approach is available to address these as well. Moreover, because the sources of liquid coolant, like chillers, are typically provided separately from the power electronic equipment, little interaction and cooperation is in place to enhance the monitoring and operation of the cooling systems, or to avoid dilatory effects of cooling system problems on the cooled equipment.

Further, industrial motor drives and other power electronic equipment may be designed with electrical voltage spacings between components and conductors to meet pollution goals or regulations, often classified by degree. For example, a pollution degree 2 environment is one where normally only non-conductive pollution occurs. Temporary conductivity, that is, not long enough to cause surface tracking caused by condensation is to be expected. Non-conductive pollution might include, for example, normal dust and airborne particles found in an office environment, and is often difficult to maintain depending upon both component temperatures (and humidities) nearby ambient temperatures and humidities. Some users of the equipment may therefore specify a more demanding (i.e., higher) pollution degree (e.g., more tolerant of higher humidities) in an effort to avoid unintended surface tracking failures to that non-conductive pollution that becomes conductive with humidity condensation. But such equipment is generally more expensive due to design considerations required in the event of condensation.

BRIEF DESCRIPTION

In a first embodiment, a system comprises power electronic circuitry that, in operation, converts input power from a source to output power adapted for a load, the power electronic circuitry including a heat extraction component that draws heat from the power electronic circuitry by circulating a liquid coolant flow therethrough, an enclosure in which the power electronic circuitry is disposed, a fan that, in operation, causes a flow of ambient air from outside the enclosure to be circulated inside the enclosure to draw heat from the heat extraction component, and sensors for detecting parameters of the air flow inside the enclosure. A thermal manager, in operation, processes signals from the sensors and determines temperature and relative humidity of at least one region of interest in the enclosure and produces an output signal representative of at least one of the determined relative humidity or a parameter setting of a liquid chilling system that provides the liquid coolant flow.

In another embodiment, a method comprises circulating a liquid coolant flow through a heat extraction component of power electronic circuitry that, in operation, converts input power from a source to output power adapted for a load, the power electronic circuitry being disposed in an enclosure, directing a flow of ambient air from outside the enclosure to inside the enclosure to draw heat from the heat extraction component, and detecting parameters of the air flow inside the enclosure. The detected parameters are processed to determine temperature and relative humidity of at least one region of interest in the enclosure, and to produce an output signal representative of at least one of the determined relative humidity or a parameter setting of a liquid chilling system that provides the liquid coolant flow.

In a further embodiment, a non-transitory computer-readable medium comprising computer-executable instructions that, when executed, are configured to cause a processor to process detected parameters of air flow inside an enclosure housing power electronic circuitry that converts input power from a source to output power adapted for a load and that is cooled by circulating a liquid coolant flow through a heat extraction component, the air flow being directed from ambient air from outside the enclosure to inside the enclosure to draw heat from the heat extraction component. The processing determines temperature and relative humidity of at least one region of interest in the enclosure, and produces an output signal representative of at least one of the determined relative humidity or a parameter setting of a liquid chilling system that provides the liquid coolant flow.

DRAWINGS

These and other features, aspects, and advantages of the presently disclosed embodiments will become better understood when the following detailed description is read with reference to the accompanying drawings in which like characters represent like parts throughout the drawings, wherein.

DETAILED DESCRIPTION

Presently disclosed embodiments are directed to systems and methods for monitoring and analyzing thermal conditions of liquid cooled power electronic devices, such as motor drives in industrial applications. The techniques disclosed allow for data collection, followed by computations that can identify installation issues, degradation issues, and during operation, possible issues with condensation, unintentional blockage/reduction of flow, contamination accumulation, inappropriate coolant type, and the like that can affect performance of the system circuitry. In some embodiments, the approaches provide alarms or notices to operators who can correct problems or adjust system settings. In other embodiments, recommendations can be made for operator or even closed loop control of the refrigeration equipment that provides the cooling liquid flow.

Moreover, the present techniques may be used to evaluate the potential for condensation to accommodate pollution degree goals and regulations. That is, users and operators may be able to use less stringent pollution degree-rated systems where the risk of condensation can be effectively avoided or at least operations personnel can be notified of such risks before condensation occurs. An advantage of such operation may be that the initial and lifetime costs of the systems may be reduced as compared to costs of higher pollution-rated systems. By way of example, creepage and clearance spacing and insulation may be defined according to the pollution degree rating. In the field, pollution degree is a classification according to the amount of dry pollution and condensation present in the environment. Classification bodies such as Underwriters Laboratories (UL) and the International Electrotechnical Commission (IEC) establish such standards. An example of such classification is provided in US 61010-1, which is hereby incorporated into the present disclosure by reference. In particular, it may be much less costly if power electronic equipment, such as industrial motor drives, could be used that comply with "Pollution Degree 2" standards rather than "Pollution Degree 3" requirements.

Figure 1:
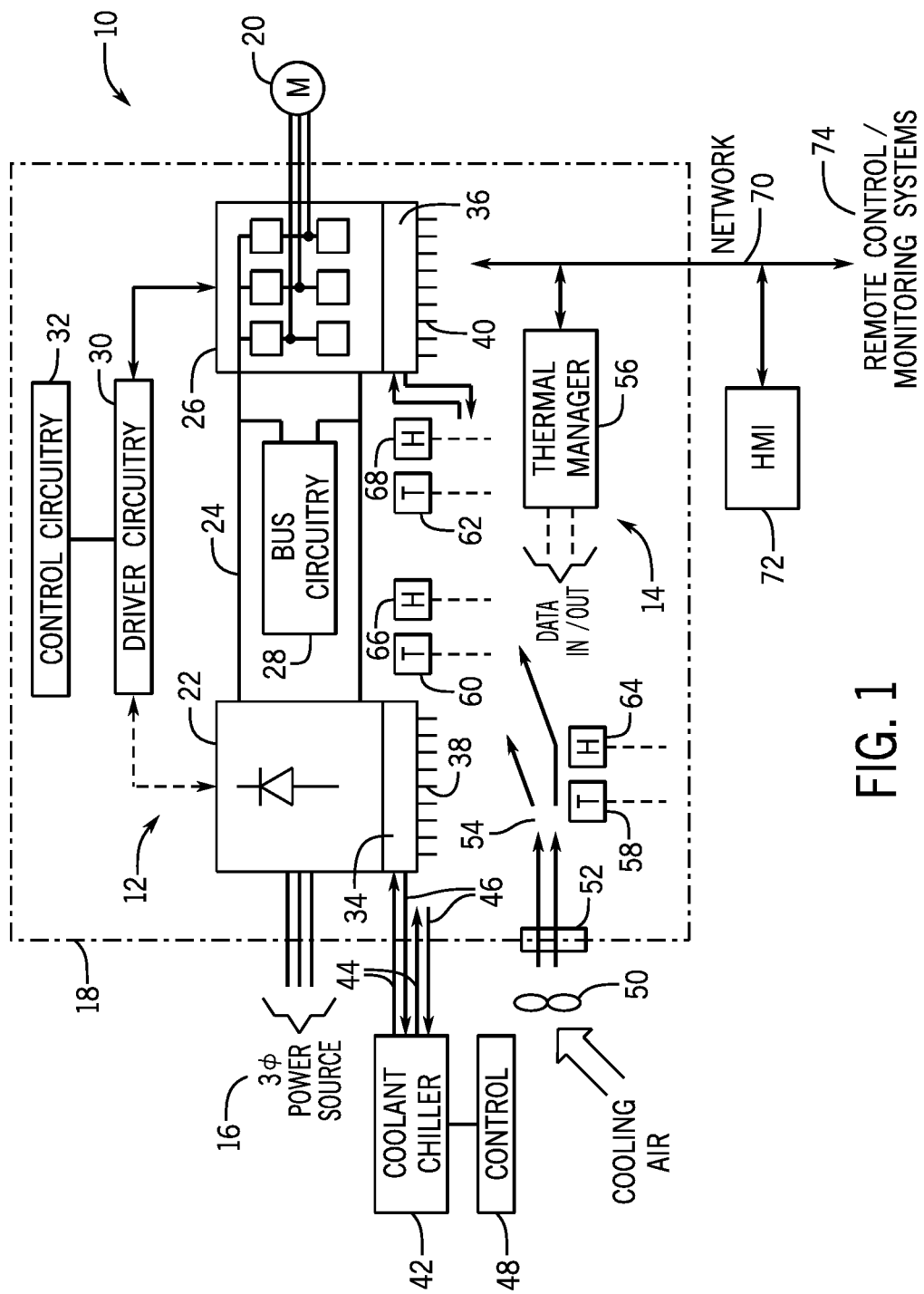
FIG. 1 is a schematic diagram of an exemplary power electronic system, such as a motor drive, with a thermal management system that monitors parameters of cooling and provides output and/or control based on analysis of the parameters.

Turning now to the drawings, FIG. 1 is a schematic diagram of an exemplary power electronic system 10 that, in this case, includes a motor drive 12. The system is equipped with a thermal management system, designated generally by reference numeral 14 that allows for monitoring thermal conditions and health of the power electronic system.

As illustrated in FIG. 1, the system 10 will receive input power from a source 16, which in most industrial applications will be a 3-phase AC power source 16, such as a power grid or generator, though other sources might be used as well. The power electronic devices and circuitry are themselves housed in an enclosure 18, such as a standard NEMA enclosure or a special purpose enclosure, such as for industrial motor control centers (MCCs). Such enclosures generally provide for physically housing the equipment, but also allow for a controlled interior environment where environmental conditions can be monitored and controlled, as described below. In the case of the power electronic system shown, the input power is transformed and converted to a form suitable for a load, such as an electric motor 20.

In the case of the motor drive 12, the input power is applied to rectifier circuitry 22 that converts the AC power to DC power for application to a DC bus 24. As will be appreciated by those skilled in the art, the rectifier circuitry may be designed as passive circuitry that operates without switching control, or as active circuitry that includes an array of interconnected switches (e.g., IGBTs) that are controlled to provide the desired DC output. Such circuitry may also allow for useful functions such as regenerative braking, and so forth. Power on the DC bus is then applied to inverter circuitry 26 where, in the case of a variable frequency motor drive, it is converted to controlled frequency AC output power for the load. Again, as will be appreciated by those skilled in the art, such inverter circuitry may include an array of interconnected switches (e.g., IGBTs and bypass diodes) that are switched in a controlled manner to provide the desired frequency of the output power. In general, motors such as industrial induction motors can thus be driven at desired speeds that are generally proportional to the output power frequency. Of course, special control regimes may be provided by the control of the switching, such as torque control, vector control, and so forth. Bus circuitry 28 may be provided, such as for improved regulation of voltages, currents, and general operation of the DC bus. Finally, driver circuitry 30 and control circuitry 32 are provided that enable the desired switching of the power electronic switches of the inverter circuitry. The control circuitry 32 provides drive signals to the drive circuitry based on one or more control schemes that are stored in memory of the control circuitry and that are appropriately programmed at the time of commissioning of the equipment (or at any time thereafter). The driver circuitry is illustrated as communicatively connected to the inverter circuitry 26, and optionally to the rectifier circuitry 22 (e.g., when the rectification is done with active control). As will be appreciated by those skilled in the art, the control will often be done in a closed loop manner based on feedback signals from sensors that are not separately shown in the figures. Such control may allow for speed control, starting, stopping, ramping up and down speeds, synchronization with other equipment and downstream processes, among many possible options.

The component labeled by reference numeral 26 in the figures represents the power electronic switching devices and associated circuitry, which may be referred to as the power structure or power modules. In many cases, the power electronic switches themselves will be mounted on a substrate that itself is mounted on a chill plate as represented by reference numerals 34 and 36. Such chill plates will typically include a thermally conductive (e.g., metal) structure through which channels are formed to receive an circulate a cooling fluid. The plates may include various circuitous paths for the cooling fluid, as well as internal features to enhance thermal transfer. In addition, they may include external features such as fins 38 and 40 that allow for extraction of heat by convective transfer to the internal air of the enclosure. Due to the currents involved in their operation, and to the rapid switching under controlled conditions, the power electronic switches may generate considerable heat that is extracted by the associated chill plate to improve their operation and prolong their useful life. It should be noted, however, that other components in the power structure may also generate heat during operation, such as filter inductors and capacitors, bus capacitors, and so forth. These can also be cooled in similar ways, and the performance of their cooling components evaluated as discussed in the present disclosure.

A flow of cooling liquid is provided to the one or more chill plates of the system by a coolant chiller 42. In many cases this equipment will be located outside the electrical enclosure to permit heat rejection to the ambient environment. The inflow or feed of cooled liquid is designated by reference numeral 44 in the figures, while the return of liquid heated by circulation though the chill plates is designated by reference numeral 46. In the illustrated embodiment, the cooling liquid system is closed such that the liquid is continuously heated and cooled as it removes and then rejects heat created by operation of the power electronic equipment. Regulation of the operation of the coolant chiller 42 is provided by control circuitry as indicated generally by reference numeral 48. In general, the coolant chiller and the associated control may be based on any desired refrigeration cycle, and will typically attempt to maintain a temperature setpoint for the liquid coolant flow fed to the chill plates, and various control schemes may be envisioned for such control (e.g., conventional on-off setpoint regulation, PID control, and so forth). As discussed below, setpoints and other parameters for control of the coolant chiller may be input manually by an operator, or in some cases may be based on closed loop or hybrid manual/closed loop control of setpoints, flow rates, and so forth.

Figure 3:
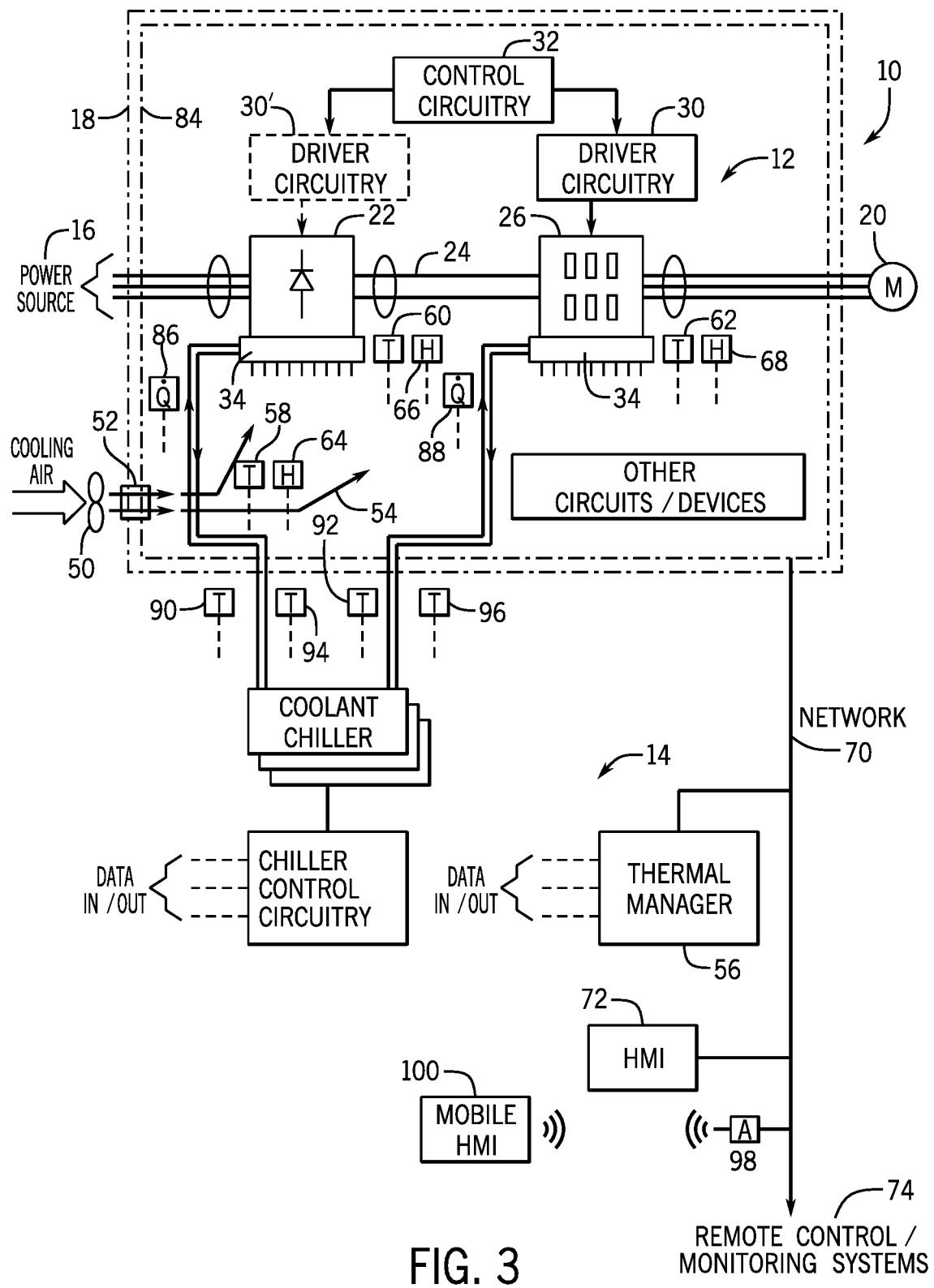
FIG. 3 is a schematic diagram of another exemplary power electronic system having additional components and sensors for cooling system monitoring and analysis.

Electronic components that are not able to be liquid cooled use forced convection air cooling to remove heat. To facilitate and enhance such transfer, one or more fans 50 are provide at an air inlet 52 of the enclosure. More than one such inlet may be present, and where desired internal conduits, channels, or define paths (not separately shown) may direct a flow of cooling air 54 towards the cooled components. Though not separately shown one or more outlets or exhausts may be provided to allow heated air to escape from the enclosure. A thermal manager 56 is provided for the monitoring and analysis functions of the system, as described more fully below. In the illustrated embodiment, this component may be provided in the enclosure with the power electronic equipment, or in some cases it may be provided outside the enclosure (as shown in FIG. 3). Further, to facilitate monitoring of thermal conditions and operation of the cooling components by the thermal manager, certain instrumentation is provided in the enclosure. In the embodiment of FIG. 1, for example, temperature sensors 58, 60, and 62 are provided for monitoring air temperatures at the inlet 52 and on or near the chill plates or the associated power structures, and humidity sensors 64, 66, and 68 are provided for monitoring humidity at the same locations. The temperature and humidity sensors may be of any known type, and provide output signals that are indicative of the temperatures and humidities, and that may be processed to provide actual or representative values for operator information, control, recordal, and so forth.

As also shown in FIG. 1, many of the components in the enclosure may be coupled to a network 70 both inside the enclosure an outside, such as a factory communication network. For example, the motor drive control circuitry may exchange data for its programming and operation with a human machine interface (HMI) 72, and with remote control and monitoring systems as indicated generally by reference numeral 74. The latter may include, for example, automation controllers, enterprise monitoring and control systems, other motor drives, and so forth. The same is true of the thermal manager 56, which over the network may provide indications of thermal conditions to the HMI or other monitoring and control devices. As noted below, in some presently contemplated embodiments, the HMI may allow for the display of notices, alarms, recommendations, and so forth relating to thermal conditions present or possible in the enclosure as determined by the thermal manager.

As discussed below, many possible operations may be envisaged and performed by the thermal manager. For example, depending upon the conditions of the ambient air surrounding the enclosure, its introduction into the enclosure for heat extraction may result in condensation, particularly if the liquid coolant temperature is below the dew point. Therefore, the thermal manager may determine the relative humidity of the cooling air flow inside the enclosure, evaluate the possibility of condensation, and output a signal in the form of an alert or notice for operators, or may even provide recommended temperature setpoints for manual or automatic control of the coolant chiller. Moreover, the thermal manager may perform evaluation functions upon initial commissioning of the equipment, such as to determine whether piping connections between the coolant chiller and the chill plates were properly made or reversed. The thermal manager may also perform monitoring and analysis functions over time, such as to determine performance degradations that may occur episodically (e.g., by short-term fouling or clogging of the cooling components) or over extended periods (e.g., due to slower component fouling, erosion and corrosion, and so forth). The monitoring and analysis functionality of the thermal manager may also be used to ensure compliance with various international pollution degree standards, which is a classification according to the amount of dry pollution and condensation present in the environment.

Figure 2:
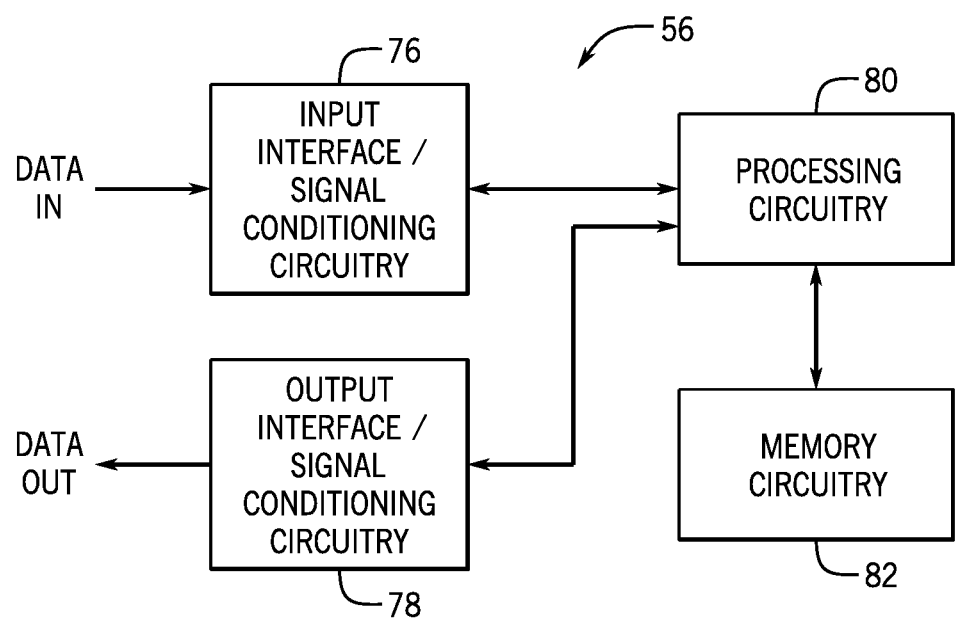
FIG. 2 is a schematic diagram of an exemplary thermal manager for a system of the type shown in FIG. 1.

FIG. 2 illustrates exemplary functional components of the thermal manager 56. In this example, input interface/signal conditioning circuitry 76 serves to receive data from the sensors and any external devices that may provide configuration programming and data or operational data to the manager. Similarly, output interface/signal conditioning circuitry 78 outputs data based on the monitoring and analysis operations performed by the manager. These interfaces may provide for databus traffic interfacing, data conversion, and so forth as will be readily appreciated by those skilled in the art. Processing circuitry 80 is coupled to the interfaces and to memory circuitry 82, and performs any programmed monitoring operations based upon programming stored in the memory circuitry, settings stored in the memory circuitry, and so forth. Any suitable processing and memory circuitry may be provided, such as microprocessors, CPUs, and so forth, and both volatile and non-volatile memory. In operation, the memory circuitry serves as a non-transitory computer-readable medium comprising computer-executable instructions that, when executed, are configured to cause the processor to perform the operations described in the present disclosure. It should also be noted that, while the thermal manager 56 discussed in connection with the presently contemplated embodiments may be a stand-alone component, is some other embodiments, it may be incorporated in another component (e.g., an automation controller, motor drive, or other automation component), and use interface circuitry, processing capacity, and memory already provided in that component (e.g., as an optional product offering).

FIG. 3 illustrates a somewhat different configuration of the system 10 from that of FIG. 1. That is, in some cases, such as in the case of MCCs or systems comprising multiple motor drives or motor drives with other power components, the power electronic circuitry may be provided in a subenclosure 84 that itself is housed in a larger enclosure 18. In such cases, the thermal management may be primarily concerned with the environment in the subenclosure. In some cases, similar or the same thermal management scheme may be used for multiple subenclosures within a larger enclosure 18, or even within the larger enclosure itself. Further, in the embodiment of FIG. 3, flow sensors 86 and 88 may be provided to monitoring flow rates of the liquid coolant flow. It should be noted that in some presently contemplated embodiments, such flow sensors may not be used, depending upon the functionality sought and the data to be analyzed. Similarly, liquid coolant temperature sensors 90 and 92 may monitor the temperatures of inlet liquid coolant flow, while additional temperature sensors 94 and 96 may monitor the temperatures of the outlet or return flow. As noted above, in this embodiment, the thermal manager 56 is positioned outside the enclosure 18. Still further, here an access point 98 is provided for wireless communication with a mobile HMI 100, which may be, for example, a thin-client HMI, a mobile phone, tablet, and the like. Such devices may allow for free movement of operations personnel while remaining apprised of thermal conditions in the enclosure and any possible notices, alerts, recommendations, and so forth.

FIG. 3 also indicates that other circuits and devices may be present in the enclosure, and it is contemplated that such devices may also be monitored, where desired, to determine cooling, heating, potential for condensation, and so forth as outlined below. Indeed, this may be done in certain regions or areas of the enclosure even if sensed temperatures and humidities are not immediately adjacent to chill plates. Such devices may include, for example, manifolds, inductors, filters, power modules, circuit boards, and so forth, with or without chill plates.

Figure 4:
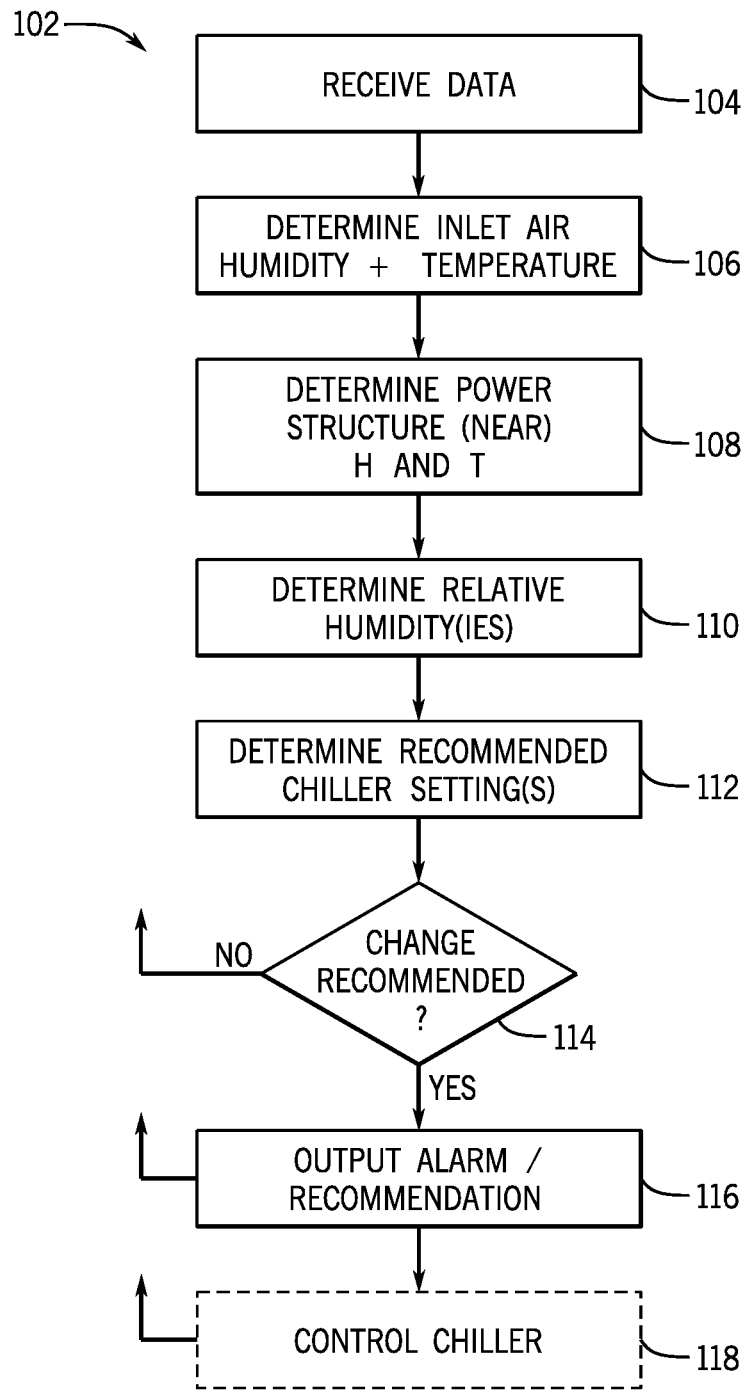
FIG. 4 is a block diagram illustrating exemplary logic for performing various functions performed by the thermal management system of the preceding figures.
Figure 6:
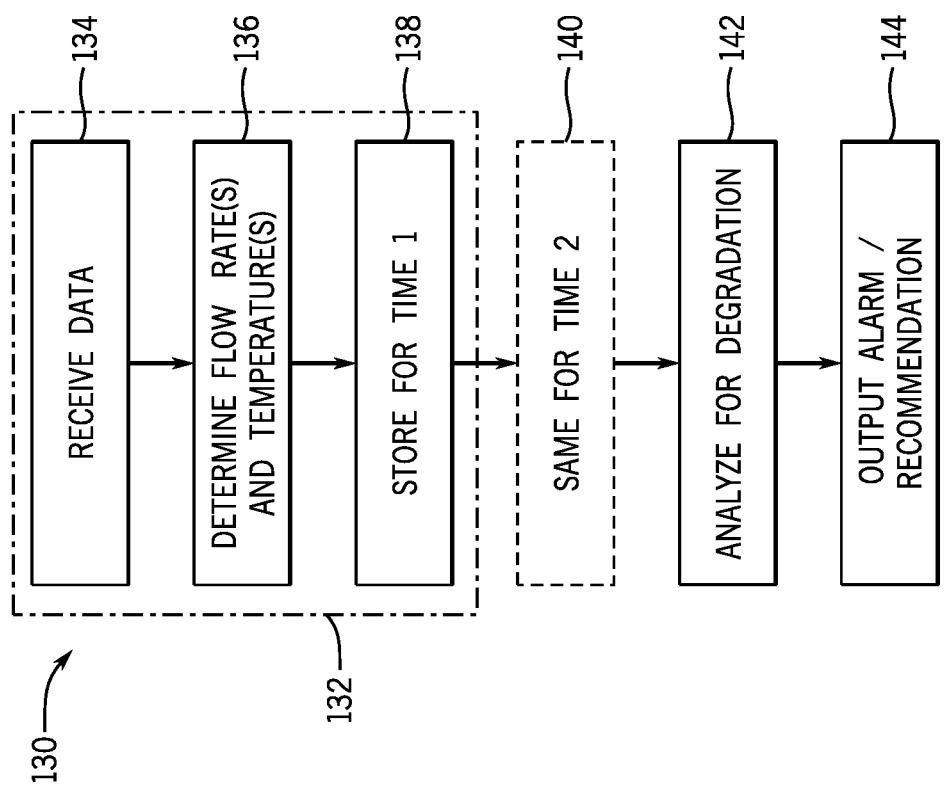
FIG. 6 is a block diagram illustrating exemplary logic for yet another type of analysis that may be performed by the thermal management system.
Figure 5:
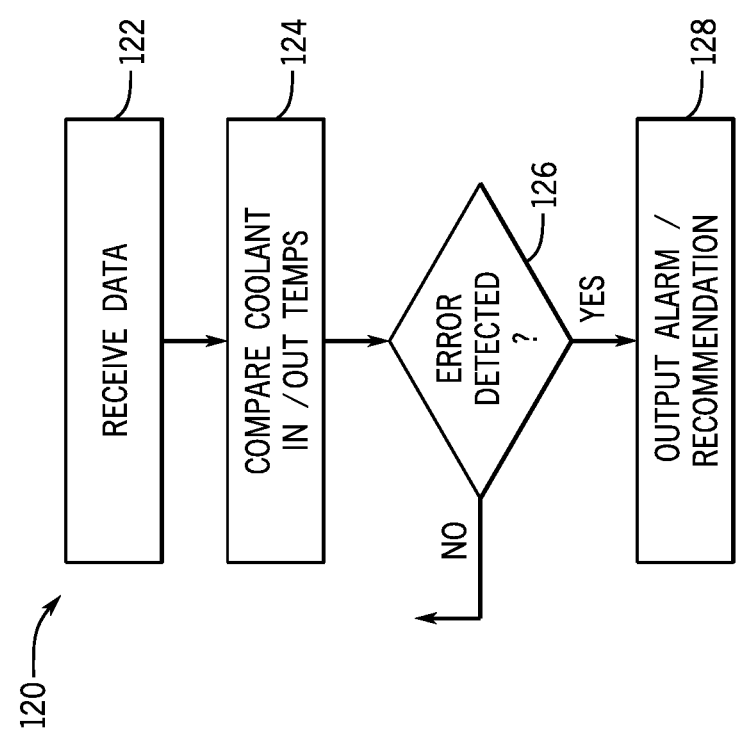
FIG. 5 is a block diagram illustrating exemplary logic for additional analysis that may be performed by the thermal management system.

As noted, a number of different monitoring, analysis, and notice or control operations are enabled by the systems described, and are presently contemplated. Exemplary logic that may be executed by the systems is illustrated in FIGS. 4, 5, and 6. In the logic 102 of FIG. 4, the humidity and potential for condensation in the enclosure or on or near the system components are monitored. For example, the logic begins with receiving data, as indicated by operation 104. This may include receiving signals related to the temperatures and humidities of the incoming cooling air flow, as well as temperatures and humidity signals on or near certain important components, particularly the chill plates described above. Where desired, signals may also be received and considered that are related to the coolant liquid flow, and its temperatures. Where available, temperatures of other components, including the power structure itself may also be received and processed. Such processing may follow processes outlined in U.S. Pat. No. 9,092,030, issued to Weiss et al., which is hereby incorporated into the present disclosure by reference for all purposes.

Returning to FIG. 4, at operation 106 the received signals are processed by the thermal manager to determine the cooling air humidity and temperature. This operation may include any signal conversion useful to compute a value representative of the humidity and temperature, depending upon the nature of the sensed and received signals. Then at operation 108 the air humidity and temperature in the close environment of the power structures are determined, which may involve similar signal conversion and computations. Based on the air conditions thus determined, one or more relative humidity calculations may be made at operation 110 to find the specific air conditions at the specific locations monitored. As will be appreciated by those skilled in the art, the relative humidity is the ratio of partial pressure of water vapor in the air to the equilibrium vapor pressure. In general, this represents the relative saturation of the air. Based upon this relative humidity, the dew point of the air may be determined, which represents the temperature at which condensation will occur. One or more of these parameters are considered at operation 110, and it should be borne in mind that an actual numerical value of relative humidity and/or dew point may or may not be computed based on the sensed data. However, useful in this logic is the ability to compare the relative humidity and/or dew point of the cooling air flow inside the enclosure to the temperature of the chill plates to determine the potential for initiation of condensation. It may be desired, for example, that the liquid coolant flow temperature (and thereby the chill plate temperature) be maintained several degrees above the dew point as determined by the relative humidity. These computations, and comparisons are made at operations 110 and 112 of FIG. 4, to determine a recommended setting (e.g., temperature setpoint) of the liquid coolant flow and chiller.

It should be noted that in these operations, reference may be made, or the system parameters may be set to take into account any pollution degree rating of the equipment (e.g., Pollution Degree 2 versus Pollution Degree 3). The system may therefore effectively verify compliance with the equipment pollution degree classification, and provide temperature set points, notifications, and where useful, alarms to avoid condensation in accordance with the pollution classification of the equipment.

It should be borne in mind that the actual calculations may be made on an ongoing or periodic basis, and as ambient air conditions change (e.g., due to weather changes), the calculations and recommendations may account for this. Similarly, transport time delays, offsets due to flow or heat transfer through system conduits may of course be considered (e.g., for chiller setpoint calculation). Additionally, as noted above, the system may or may not output actual numerical values of parameters such as relative humidity, dew point, and so forth, but may use values that are operationally effective for the notice, alarm, monitoring and control functions contemplated.

At operation 114 the system may determine whether a change is recommended. In some cases, the system may not be aware of the actual temperature set point of the chiller, but may output determine a recommendation at operation 114 (which may or may not match the actual current set point). At operation 116, then, an alarm or recommendation may be output by the system. In many cases, this may take the form of a visual display element that can be received, interpreted and displayed on the system HMI. Where there exists a high possibility of condensation (e.g., where the relative humidity of the cooling air flow indicates that the temperatures near components are approaching the dew point), the output may be an actual alarm. In some cases, the output may be simply informational (e.g., the temperature (s), humidity(ies), dew point(s), and so forth). As also shown in FIG. 4, the system may allow for actual closed loop control of the chiller settings. In such cases, based on the sensed data, and the calculated relative humidity and/or dew point, the thermal manager may output a signal for changing the chiller set point or some other parameter of its operation, as indicated by operation 118. The upward arrows in the figure are intended to indicate that these operations are ongoing (i.e., continuous or cyclical) during operation of the system.

It may be noted that the thermal monitoring and analysis performed by the system may be used for a range of other purposes, some of which may relate to the actual operation of the power electronic system. For example, the analysis may be used as a basis for modifying switching of power switches (e.g., IGBTs) in motor drives to limit cycling, reduce temperature excursions, and so forth. Further, where a system includes more than one chill plate (or monitored location), corresponding relative humidities and/or dew points may be computed and these may collectively be considered for generation of alarms, notices, recommendations (or control signals), such as to avoid approaching the highest dew point among the monitored locations.

FIG. 5 represents exemplary logic 120 for detecting errors in connections between the chiller and the chill plates. In some cases, upon initial installation and commissioning, or later upon maintenance or servicing, it is possible that inlet and outlet conduits may be inadvertently reversed such that cooler fluid is directed to a port of the chill plate that is intended to be its outlet, and vice versa. In some embodiments, optimal or design operation of the chill plates may be adversely affected by such erroneous installation. In the logic of FIG. 5, at operation 122 data is received, particularly in this case from the temperature sensors that may be associated with the inlet and outlet conduits (refer to FIG. 3). During operation of the power components, then, it would be expected, and the thermal manager may be programmed to recognize that the inlet liquid temperature should be lower than the outlet temperature. A comparison of the inlet and outlet temperatures can then be made, as indicate at operation 124. At this step (or in a separate operation), the actual component temperature rise may also be compared with the expected component temperature rise, if such values have been computed, to aid in evaluating the working order of the cooling system and electronic components. If it is determined that the outlet temperature is in fact lower than the inlet temperature, this may be used as a basis for recognizing that the conduits have been reversed. When that condition is present, it will be detected at operation 126, and an alarm or recommendation can be generated and output, as indicated at operation 128. As before, this can take the form of a display element for the system HMI, or any other interface used during initial commissioning or thereafter.

FIG. 6 illustrates exemplary logic 130 for evaluating changes in the performance of the cooling system over time. As noted above, relatively rapid changes may occur due to, for example, an obstruction that is introduce or that develops in the liquid flow paths (e.g., in the chiller, the chill plates, or any interconnection conduits or components). Degradation over time may occur due to general system degradation, chiller failure or malfunction, chill plate gradual fouling, erosion or corrosion of internal structures of the chill plate, and so forth. These may be detected and alerted to controllers and operators by the logic of FIG. 6. In general, a sequence of operations, represented by block 132 may allow for a basis for initial and ongoing monitoring and analysis. For example, at operation 134 sensed data is received. Of particular interest may be specific temperatures at specific locations (e.g., inlet air, at or near the chill plates, of cooling liquid supply and return), as well as the associated humidities, but also flow rates of liquid coolant flow. It should be noted that as mentioned above, some implementations may not use flow sensors. In such cases, temperature ranges of the circulated coolant and the power electronic components (such as IGBTs or nearby structures) may be analyzed as provided in U.S. Pat. No. 9,092,030, noted above. At operation 136 values indicative of these parameters of interest are computed, and these are stored at operation 138 (e.g., along with time stamps and any useful operational data that may help to evaluate the system conditions at the time). It may be noted that the operation 136 may include calculation of the expected temperature rise based on operation, and this may also be stored for later use in the cooling system analysis.

Then, as indicate at operation 140, these same steps may be performed at a subsequent time. In practice, this may be done at any useful interval, or in an event-driven manner (e.g., upon a parameter changing by a particular amount, such as unusual rises or declines in temperature, humidity, or flow rate). Detected changes may be determined by the analysis of operation 142 in FIG. 6. The thermal manager may be programmed to recognize that some of these noted changes represent degradation of one or more components, or some characteristic change, such as fouling, inefficient chill plate heat extraction, and so forth. At operation 144, then, the thermal manager may output an alarm (or notice), a recommendation (for attention or servicing), and so forth. Here again, this may take the form of a display component that may be provided on the system HMI or another interface (e.g., a remote system monitoring computer).

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A system, comprising:
power electronic circuitry that, in operation, converts input power from a source to output power adapted for a load, the power electronic circuitry including a heat extraction component that draws heat from the power electronic circuitry by circulating a liquid coolant flow therethrough;
an enclosure in which the power electronic circuitry is disposed;
a fan that, in operation, causes a flow of ambient air from outside the enclosure to be circulated inside the enclosure to draw heat from the heat extraction component;
sensors for detecting parameters of the air flow inside the enclosure; and
a thermal manager that, in operation, processes signals from the sensors and determines temperature and relative humidity of at least one region of interest in the enclosure and produces an output signal representative of at least one of the determined relative humidity or a parameter setting of a liquid chilling system that provides the liquid coolant flow;
wherein the sensors comprise at least a temperature sensor for detecting a signal representative of temperature of the air flow in the region of interest in the enclosure, and a humidity sensor for detecting a signal representative of humidity of the air flow in the region of interest in the enclosure; and wherein the thermal manager determines the relative humidity of the air flow on or near the heat extraction component.

2. The system of claim 1, wherein the power electronic circuitry comprises a motor drive comprising rectifier that converts input AC power to DC power on a bus, and an inverter that converts the DC power to controlled frequency AC output power to drive a motor, and wherein the heat extraction component comprises a fluid circulating chill plate associated with a power structure of the inverter.

3. The system of claim 1, wherein the sensors comprise temperatures sensors for detecting signals representative of temperature of the liquid coolant flow.

4. The system of claim 1, wherein thermal manager determines recommended setting of the liquid chilling system, and outputs the recommended setting for either manual or automatic control of the liquid chilling system to prevent condensation.

5. The system of claim 1, wherein thermal manager determines whether condensation is based on the determined relative humidity, and outputs an operator perceptible alarm based thereon.

6. The system of claim 1, wherein thermal manager determines an error in connections made to liquid chilling system.

7. The system of claim 1, wherein thermal manager determines degradation of the heat extraction component or the liquid chilling system over time, and produces an operator perceptible output based thereon.

8. A method comprising:
circulating a liquid coolant flow through a heat extraction component of power electronic circuitry that, in operation, converts input power from a source to output power adapted for a load, the power electronic circuitry being disposed in an enclosure;
directing a flow of ambient air from outside the enclosure to inside the enclosure to draw heat from the heat extraction component;
detecting parameters of the air flow inside the enclosure; and
processing the detected parameters to determine temperature and relative humidity of at least one region of interest in the enclosure, and to produce an output signal representative of at least one of the determined relative humidity or a parameter setting of a liquid chilling system that provides the liquid coolant flow;
wherein the sensors comprise at least a temperature sensor for detecting a signal representative of temperature of the air flow in the region of interest in the enclosure, and a humidity sensor for detecting a signal representative of humidity of the air flow in the region of interest in the enclosure; and
wherein thermal manager determines the relative humidity of the air flow on or near the heat extraction component.

9. The method of claim 8, comprising determining a recommended setting of the liquid chilling system, and outputting the recommended setting for either manual or automatic control of the liquid chilling system.

10. The method of claim 8, comprising determining whether condensation is based on the determined relative humidity, and outputting an operator perceptible alarm based thereon.

11. The method of claim 8, comprising determining an error in connections made to liquid chilling system.

12. The method of claim 8, comprising determining degradation of the heat extraction component or the liquid chilling system over time, and producing an operator perceptible output based thereon.

13. A non-transitory computer-readable medium comprising computer-executable instructions that, when executed, are configured to cause a processor to:
process detected parameters of air flow inside an enclosure housing power electronic circuitry that converts input power from a source to output power adapted for a load and that is cooled by circulating a liquid coolant flow through a heat extraction component, the air flow being directed from ambient air from outside the enclosure to inside the enclosure to draw heat from the heat extraction component;
wherein the processing determines temperature and relative humidity of at least one region of interest in the enclosure, and produces an output signal representative of at least one of the determined relative humidity or a parameter setting of a liquid chilling system that provides the liquid coolant flow;
wherein the sensors comprise at least a temperature sensor for detecting a signal representative of temperature of the air flow in the region of interest in the enclosure, and a humidity sensor for detecting a signal representative of humidity of the air flow in the region of interest in the enclosure; and
wherein a thermal manager determines the relative humidity of the air flow on or near the heat extraction component.

14. The non-transitory computer-readable medium of claim 13, wherein the processing comprises determining a recommended setting of the liquid chilling system, and outputting the recommendation for either manual or automatic control of the liquid chilling system.

15. The non-transitory computer-readable medium of claim 13, wherein the processing comprises determining compliance with pre-established pollution standards.

16. The non-transitory computer-readable medium of claim 13, wherein the processing comprises determining whether condensation is based on the determined relative humidity, and outputting an operator perceptible alarm based thereon.

17. The non-transitory computer-readable medium of claim 13, wherein the processing comprises determining an error in connections made to liquid chilling system or degradation of the heat extraction component or the liquid chilling system over time, and producing an operator perceptible output based thereon, or comparing inlet liquid coolant temperatures and heat extraction component temperatures to determine whether component degradation has occurred.

* * * * *